(12) United States Patent
Saito et al.

(10) Patent No.: US 7,560,859 B2
(45) Date of Patent: Jul. 14, 2009

(54) FLUORESCENT MATERIAL HAVING TWO LAYER STRUCTURE AND LIGHT EMITTING APPARATUS EMPLOYING THE SAME

(75) Inventors: Hajime Saito, Nara (JP); Tatsuya Morioka, Ikoma (JP); Shizuo Fujita, 4-7-21, Sakuragaoka, Seika-cho, Soraku-gun, Kyoto (JP) 619-0232; Yoichi Kawakami, 665-6, Shimogasa-cho, Kusatsu-shi, Shiga (JP) 525-0029; Mitsuru Funato, 48-3, Katsura Hitsujisaru-cho, Nishigyo-ku, Kyoto-Shi, Kyoto (JP) 615-8084; Masafumi Harada, 5-730-1143, Gakuendaiwa-cho, Nara-shi, Nara (JP) 631-0041; Shigeo Fujita, Kyoto (JP); Kyoko Fujita, legal representative, Kyoto (JP)

(73) Assignees: Shizuo Fujita, Kyoto (JP); Yoichi Kawakami, Kusatsu-Shiga (JP); Mitsuru Funato, Kyoto (JP); Masafumi Harada, Nara (JP); Sharp Kabushiki Kaisha, Osaka (JP)

( * ) Notice: Subject to any disclaimer, the term of this patent is extended or adjusted under 35 U.S.C. 154(b) by 156 days.

(21) Appl. No.: 11/224,131

(22) Filed: Sep. 13, 2005

(65) Prior Publication Data
US 2006/0158089 A1    Jul. 20, 2006

(30) Foreign Application Priority Data
Sep. 14, 2004    (JP)    ............................. 2004-266939

(51) Int. Cl.
*H01J 1/62*    (2006.01)
*C09K 11/77*    (2006.01)

(52) U.S. Cl. ................ 313/498; 313/499; 252/301.4 R; 977/774

(58) Field of Classification Search ....................... None
See application file for complete search history.

(56) References Cited

U.S. PATENT DOCUMENTS

| 6,207,229 | B1 | 3/2001 | Bawendi et al. |
| 6,841,933 | B2 * | 1/2005 | Yamanaka et al. ........... 313/512 |
| 7,102,152 | B2 * | 9/2006 | Chua et al. ..................... 257/14 |
| 2004/0009341 | A1 * | 1/2004 | Naasani ....................... 428/323 |
| 2004/0104391 | A1 * | 6/2004 | Maeda et al. .................. 257/79 |
| 2005/0012076 | A1 * | 1/2005 | Morioka ................ 252/301.4 R |

FOREIGN PATENT DOCUMENTS

EP    1731583 A1    12/2006

(Continued)

OTHER PUBLICATIONS

Morioka, Tatsuya (JP 2004-107572).*

*Primary Examiner*—Toan Tom
*Assistant Examiner*—Britt Hanley
(74) *Attorney, Agent, or Firm*—Birch, Stewart, Kolasch & Birch, LLP

(57) ABSTRACT

A fluorescent material excellent in emission efficiency in white emission and a light-emitting apparatus employing this fluorescent material and having excellent color rendering are provided with a fluorescent material comprising a two-layer structure of a core of a particle size having a quantum effect and a shell covering this core in which the ground state energy of the core is in the range of 1.85 to 2.05 eV, the high order energy of the core is not in the ranges of 2.3 to 2.5 eV and 2.65 to 2.8 eV, or the ground state energy of the core is in the range of 2.3 to 2.5 eV, the high order energy of the core is not in the range of 2.65 to 2.8 eV an light-emitting apparatus employing these fluorescent materials.

18 Claims, 5 Drawing Sheets

FOREIGN PATENT DOCUMENTS

| | | |
|---|---|---|
| JP | 11-340516 A | 12/1999 |
| JP | 2001-523758 A | 11/2001 |
| JP | 2002-121549 A | 4/2002 |
| JP | 2002-510866 A | 4/2002 |
| JP | 2003-246978 A | 9/2003 |
| JP | 2003-286292 A | 10/2003 |
| JP | 2004-161928 A | 6/2004 |
| JP | 2004-307679 A | 11/2004 |
| JP | 2004-315661 A | 11/2004 |
| JP | 2006-66395 A | 3/2006 |
| JP | 2007-513478 A | 5/2007 |
| WO | WO-9950916 | 10/1999 |
| WO | WO-03/021694 A2 | 3/2003 |
| WO | WO-03/054507 A2 | 7/2003 |
| WO | WO-03/058728 A1 | 7/2003 |
| WO | WO-03/085066 A2 | 10/2003 |
| WO | WO-2005/071039 A1 | 8/2005 |
| WO | WO-2005/097939 A1 | 10/2005 |

* cited by examiner

FLUORESCENT MATERIAL HAVING TWO LAYER STRUCTURE AND LIGHT EMITTING APPARATUS EMPLOYING THE SAME

This nonprovisional application is based on Japanese Patent Application No. 2004-266939 filed with the Japan Patent Office on Sep. 14, 2004, the entire contents of which are hereby incorporated by reference.

BACKGROUND OF THE INVENTION

1. Field of the Invention

The present invention relates to a fluorescent material and a light-emitting apparatus employing the same, and more specifically, it relates to a fluorescent material having a quantum effect and a light-emitting apparatus implementing white emission with the same. This light-emitting apparatus is preferably employed as an illuminator such as a backlight for a full-color display and a liquid crystal panel, for example.

2. Description of the Background Art

For example, Japanese Patent Laying-Open No. 11-340516 (1999) discloses an exemplary display and illuminator including fluorescent materials and a light-emitting device serving as a light source exciting the same. The aforementioned Japanese Patent Laying-Open No. 11-340516 discloses a technique of employing a display or an illuminator including two or three types of ZnCdSe semiconductor microcrystals having different particle sizes of not more than twice the Bohr radius of excitons as fluorescent materials and a GaN-based semiconductor light-emitting device as a light source exciting the same for obtaining white emission by exciting the fluorescent materials with excitation light emitted from the excitation light source, converting fluorescent light components to secondary light components of green and red or green, red and blue and mixing the same with each other.

When the inventors prepared a white light-emitting apparatus according to the technique described in the aforementioned Japanese Patent Laying-Open No. 11-340516, however, it was recognized that the emission intensities of blue and green fluorescent materials constituting white light were remarkably reduced as compared with a red fluorescent material to damage the color balance and the light-emitting apparatus attained neither sufficient color rendering nor sufficient emission efficiency for serving as an illuminator.

SUMMARY OF THE INVENTION

In consideration of the aforementioned problem, an object of the present invention is to provide a fluorescent material excellent in emission efficiency for white emission and a light-emitting apparatus excellent in color rendering employing the same.

The inventors have studied the reason why the emission intensities of the blue and green fluorescent materials were reduced in the conventional light-emitting apparatus, to recognize that the green and red fluorescent materials absorbed the light component emitted from the blue fluorescent material while the red fluorescent material also absorbed the light component emitted from the green fluorescent material to damage the color balance and reduce the emission intensities due to the design of the light-emitting apparatus. They have deeply studied a method of solving this problem to find that this object can be attained by controlling the band gaps of the fluorescent materials so that the high order energy of the red fluorescent material does not coincide with green and blue emission wavelengths while the high order energy of the green fluorescent material does not coincide with the blue emission wavelength, and reached the present invention. In other words, the present invention is as follows:

A fluorescent material according to the present invention comprises a two-layer structure of a core of a particle size having a quantum effect and a shell covering this core, while the ground state energy of the core is in the range of 1.85 to 2.05 eV, the high order energy of the core is not in the ranges of 2.3 to 2.5 eV and 2.65 to 2.8 eV, and the fluorescent material colors red with a peak wavelength of 600 to 670 nm by light absorption (this fluorescent material is hereinafter referred to as "first fluorescent material").

The first fluorescent material according to the present invention causes no light absorption when employed along with blue and green illuminants, and does not damage green and blue emission intensities in white emission resulting from color mixing. Therefore, white emission excellent in color purity and color rendering can be obtained.

The present invention also provides another fluorescent material comprising a two-layer structure of a core of a particle size having a quantum effect and a shell covering this core, while the ground state energy of the core is in the range of 2.3 to 2.5 eV, the high order energy of the core is not in the range of 2.65 to 2.8 eV, and the fluorescent material colors green with a peak wavelength of 500 to 540 nm by light absorption (this fluorescent material is hereinafter referred to as "second fluorescent material").

The second fluorescent material according to the present invention causes no light absorption when employed along with a blue illuminant, and does not damage the blue emission intensity in white emission resulting from color mixing. Therefore, white emission excellent in color purity and color rendering can be obtained.

In each of the first and second fluorescent materials, the band gap of the shell is preferably larger than 2.8 eV.

In each of the first and second fluorescent materials, the particle size of the core is preferably not more than twice the Bohr radius.

In each of the first and second fluorescent materials, the particle size of the shell is preferably at least 1 μm.

In each of the first and second fluorescent materials, the surface of the shell is preferably coated or adsorbed with a material different from the materials of the shell and the core. In this case, the material for coating or adsorbing the surface of the shell is more preferably an inorganic oxide.

In each of the first and second fluorescent materials according to the present invention, the core is preferably made of a group III-V compound semiconductor containing at least In or a group II-VI compound semiconductor containing at least Zn.

In each of the first and second fluorescent materials according to the present invention, the shell is preferably made of a group III nitride semiconductor containing at least Ga or a group II-VI compound semiconductor containing at-least Zn.

According to the present invention, both the core and the shell are preferably made of $In_xGa_{1-x}N$ ($0 \leq x \leq 1$).

The present invention also provides a light-emitting apparatus comprising a red fluorescent material and a green fluorescent material homogeneously dispersed in a medium for presenting white emission as a whole by absorbing blue excitation light with the red fluorescent material and the green fluorescent material and generating secondary light. The red fluorescent material comprises a two-layer structure of a core of a particle size having a quantum effect and a shell covering this core, the ground state energy of the core is in the range of 1.85 to 2.05 eV and the high order energy of the core is not in the ranges of 2.3 to 2.5 eV and 2.65 to 2.8 eV, while the green fluorescent material comprises a two-layer structure of a core of a particle size having a quantum effect and a shell covering this core, the ground state energy of the core is in the range of 2.3 to 2.5 eV, and the high order energy of the core is not in the range of 2.65 to 2.8 eV.

The light-emitting apparatus according to the present invention causes no light absorption when employing the aforementioned-first and second fluorescent materials with a blue illuminant, and does not damage green and blue emission intensities in white emission. Therefore, the light-emitting apparatus can present white emission excellent in color purity and color rendering.

This light-emitting apparatus according to the present invention preferably further comprises a light-emitting device, having a peak wavelength in the range of 380 to 420 nm, made of a group III nitride semiconductor or a group II-VI compound semiconductor as a light source emitting the excitation light.

The light-emitting apparatus according to the present invention preferably includes a blue fluorescent material, comprising a two-layer structure of a core of a particle size having a quantum effect and a shell covering this core with the ground state energy of the core in the range of 2.65 to 2.8 eV, in the medium.

In the light-emitting apparatus according to the present invention, the medium is preferably at least any material selected from epoxy resin, silicon resin, polycarbonate resin and acrylic resin, or glass. This medium preferably includes a light diffusion material scattering and color-mixing primary light and/or the secondary light.

The light-emitting apparatus according to the present invention preferably further comprises a reflector provided oppositely to the medium through a light source emitting the excitation light for reflecting the excitation light and/or said secondary light.

The light-emitting apparatus according to the present invention preferably further comprises an optical film provided between a light source emitting the excitation light and the medium for transmitting the excitation light while blocking the secondary light. In this case, the optical film preferably blocks ultraviolet light having a wavelength of less than 380 nm.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
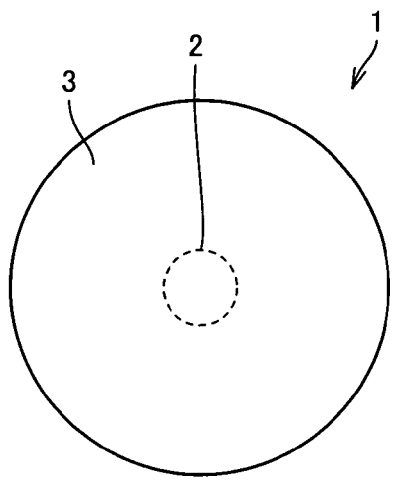
FIG. 1 is a diagram schematically showing the basic structure of a fluorescent material according to the present invention.

FIG. 1 schematically illustrates the basic structure of a fluorescent material according to the present invention. Each of first and second fluorescent materials according to the present invention basically comprises a two-layer structure of a core 2 of a particle size having a quantum effect (quantum size effect) and a shell 3 covering this core 2. The term "quantum effect" indicates an effect remarkably presenting wave motion by confining electrons in a nanometer-sized space. When a fluorescent material constituted of a semiconductor material is reduced in size to a degree exhibiting a quantum effect, state density can take only a plurality of specific values due to discretion. The plurality of discrete energy levels are defined by the particle size of the semiconductor material in addition to properties such as effective mass and permittivity. Light emission takes place between ground state levels of conduction and valence bands, and absorption takes place also between high order levels allowing transition. Throughout the specification, energy corresponding to that between ground state levels of conduction and valence bands is referred to as "ground state energy", and energy between high order levels allowing transition is referred to as "high order energy".

A first fluorescent material 1 according to the present invention is a red fluorescent material comprising the aforementioned two-layer structure of the core 2 and the shell 3. The core 2 has ground state energy in the range of 1.85 to 2.05 eV and high order energy not in the ranges of 2.3 to 2.5 eV and 2.65 to 2.8 eV, and the fluorescent material 1 colors red with a peak wavelength of 600 to 670 nm by light absorption.

In the first fluorescent material 1 according to the present invention, the ground state energy of the core 2 is in the range of 1.85 to 2.05 eV, more preferably in the range of 1.9 to 1.95 eV. An emission wavelength remarkably exceeds that of red to deteriorate color rendering in white emission if the ground state energy of the core 2 is less than 1.85 eV while the emission wavelength is remarkably shorter than that of red to deteriorate color rendering in white emission if the ground state energy of the core 2 exceeds 2.05 eV, and the object of the present invention cannot be attained in either case. The ground state energy of the core 2 can be measured by preparing a fluorescent material consisting of only the core 2 and analyzing the absorption spectrum thereof with an absorption spectrum measuring apparatus, for example, as generally performed in this field.

In the first fluorescent material 1 according to the present invention, the high order energy of the core 2 is not in the ranges of 2.3 to 2.5 eV and 2.65 to 2.8 eV. If the high order energy of the core 2 is in the range of 2.3 to 2.5 eV in the first fluorescent material 1 according to the present invention, high order levels absorb green emission when the first fluorescent material 1 is mixed with a green fluorescent material for obtaining white emission, to disadvantageously damage the color balance and deteriorate color rendering. If the high order energy of the core 2 is in the range of 2.65 to 2.8 eV in the first fluorescent material I according to the present invention, on the other hand, high order levels absorb blue emission when the first fluorescent material 1 is mixed with a blue fluorescent material for obtaining white emission, to disadvantageously damage the color balance and deteriorate color rendering. Thus, the object of the present invention cannot be attained if the high order energy of the core 2 is in the ranges of 2.3 to 2.5 eV and 2.65 to 2.8 eV. The high order energy of the core 2 can be measured by preparing a fluorescent material consisting of only the core 2 and analyzing the absorption spectrum thereof with an absorption spectrum measuring apparatus, for example, as generally performed in this field.

While the high order energy of the core 2 is not particularly restricted so far as the same is out of the aforementioned ranges in the first fluorescent material 1 according to the present invention, primary high order energy is preferably less than 2.3 eV and both of the primary high order energy and secondary high order energy are preferably less than 2.3 eV for such a reason that merely the primary high order energy and the secondary high order energy exhibit high light absorptivity and it is difficult to control the emission wavelength due to an excessive quantum effect if the difference between the ground state energy and the primary high order energy is excessively large.

Figure 2:
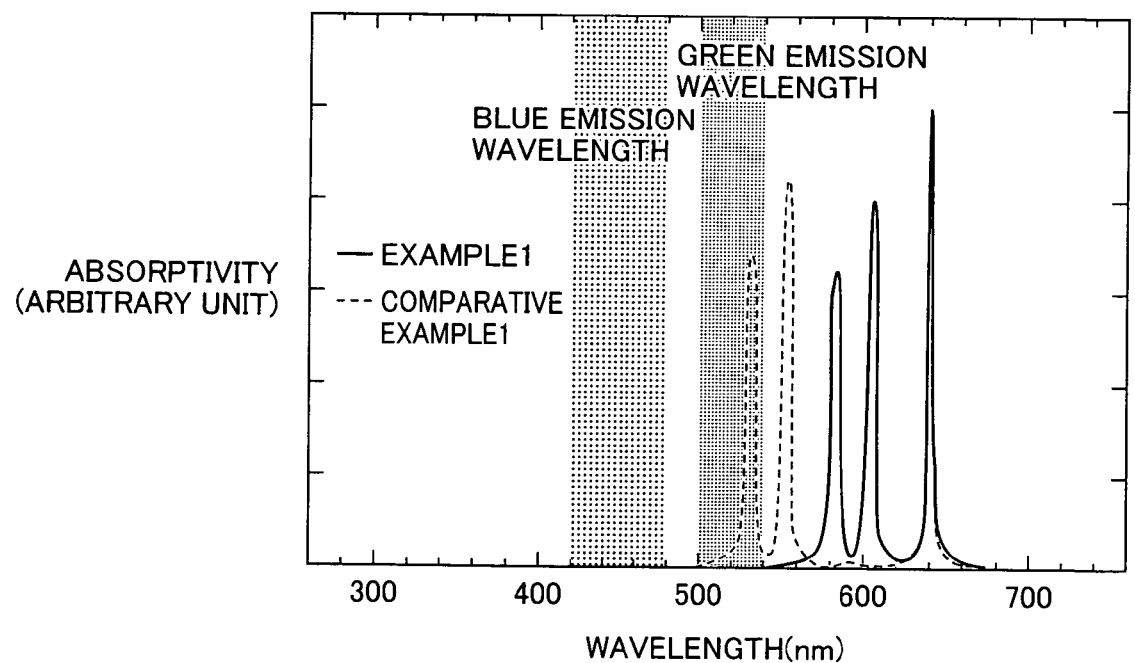
FIG. 2 is a graph showing results of measurement of absorption spectra of fluorescent materials, with a solid line showing the absorption spectrum of an exemplary first fluorescent material (Example 1 described later) according to the present invention and a broken line showing the absorption spectrum of an exemplary comparative fluorescent material (comparative example 1 described later)

FIG. 2 is a graph showing results of measurement of absorption spectra of fluorescent materials. Referring to FIG. 2, a solid line shows the absorption spectrum of an exemplary first fluorescent material (Example 1 described later) according to the present invention, and a broken line shows the absorption spectrum of an exemplary comparative fluorescent material (comparative example 1 described later). When the fluorescent materials according to Example 1 and comparative example 1 were mixed with blue light and green light, white emission was observed in Example 1 while no white emission was observed in comparative example 1, as described later. The first fluorescent material according to the present invention, having high order energy not overlapping with emission energy corresponding to green or blue, causes no light absorption when employed along with green and blue illuminants. Therefore, the first fluorescent material according to the present invention can present white emission excellent in color purity and color rendering by mixing of light components of three primary colors (hereinafter simply referred to as "color mixing") without damaging green and blue emission intensities.

In the graph shown in FIG. 2, the fluorescent material according to Example 1 exhibits absorption at 605 nm and 585 nm, both deviating from the emission wavelengths of blue and green light-emitting diodes. Thus, the shell 3 forming the outer peripheral portion of the first fluorescent material 1 absorbs excitation light (peak wavelength: 380 to 420 nm, energy: 2.95 to 3.25 eV) emitted from a blue light-emitting device such as a light-emitting diode employing a group III nitride semiconductor or the like, so that energy makes a transition to the core 2 enclosed with the shell 3. Absorbed light energy makes a transition between ground state levels of conduction and valence bands of the core 2, which in turn emits light of a wavelength corresponding to ground state energy as secondary light. The shell 3 has a band gap larger than the energy of the secondary light emitted from the core 2, whereby the fluorescent material 1 radiates the emission without self absorption. Thus, the fluorescent material 1 can emit balanced white light by the aforementioned color mixing with blue and green. On the other hand, the fluorescent material according to comparative example 1 having absorption at 540 nm absorbs light emitted from a green light-emitting diode. In such a red fluorescent material having high order energy overlapping with emission energy corresponding to green and blue, therefore, the emission intensity is reduced due to absorption of green emission to inhibit white emission due to change of the color balance.

While the ground state energy of the core 2 must be in the range of 1.85 to 2.05 eV and the high order energy of the core 2 must not be in the ranges of 2.3 to 2.5 eV and 2.65 to 2.8 eV corresponding to the green and blue emission wavelengths respectively as hereinabove described, the ground state energy and the high order energy depend on the particle size and the composition ratio of the core 2. In other words, the high order energy can be arbitrarily varied with the particle size and the composition ratio of the core 2 while keeping the ground state energy intact.

While the particle size of the first fluorescent material 1 according to the present invention can be obtained by observation with a transmission electron microscope or analysis of the line width of an X-ray diffraction peak, the particle size of the core 2 provided in the fluorescent material 1 can be obtained by the aforementioned method of measuring the ground state energy of the core 2, on can be estimated on the basis of emission from ground state levels caused by the quantum size effect by measuring the emission wavelength of the fluorescent material in the two-layer structure covered with the shell 3.

Figure 3:
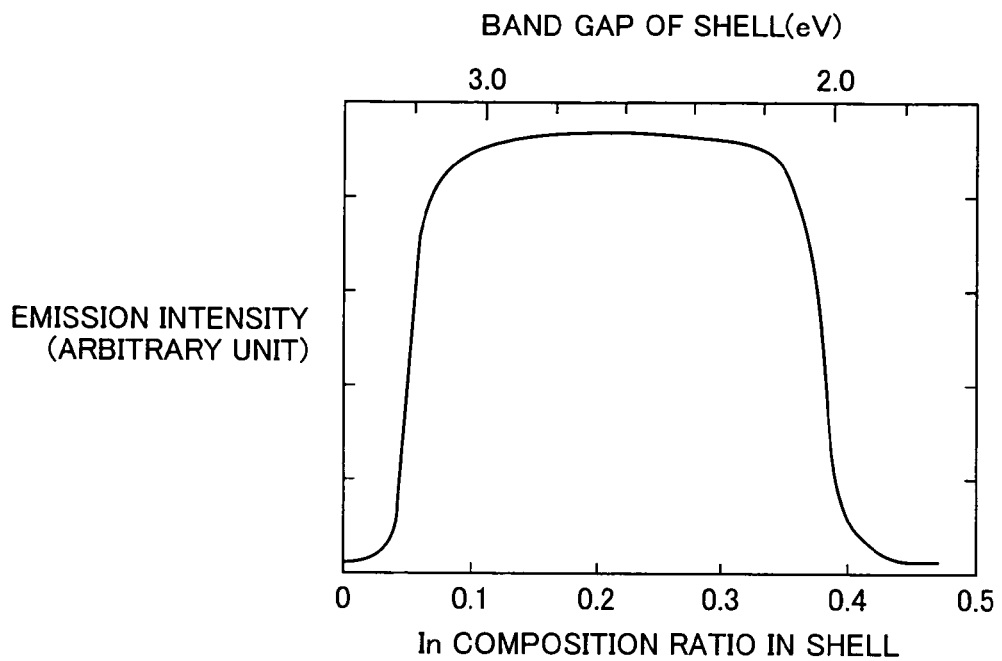
FIG. 3 is a graph showing results of emission intensities measured at various composition ratios of a shell in the first fluorescent material.

FIG. 3 is a graph showing results of emission intensities measured at various composition ratios of the shell in the first fluorescent material. Referring to FIG. 3, the shell, constituted of InGaN, of the first fluorescent material was excited with an InGaN semiconductor light-emitting device of 410 nm in wavelength for measuring emission intensities at various In composition ratios. As shown in FIG. 3, the band gap of the shell was not more than 2.0 eV, i.e., smaller than the band gap of the core, when the In composition ratio was in excess of 0.4. Thus, the first fluorescent material conceivably caused neither energy transition to nor quantum confinement in the core but was reduced in emission intensity. When the In composition ratio was not more than 0.05, on the other hand, the band gap of the shell exceeded 3.0 eV, and the first fluorescent material was conceivably reduced in emission intensity due to no absorption of excitation light from the InGaN semiconductor light-emitting device. Thus, the band gap of the shell must be larger than the ground state energy of the core and smaller than energy corresponding to the wavelength of the excitation light in the first fluorescent material. If the band gap of the shell is smaller than emission energy corresponding to green or blue constituting white emission, however, the shell disadvantageously absorbs the emission similarly to the case of the high order energy of the core. Therefore, the band gap of the shell is preferably larger than 2.8 eV, particularly preferably larger than 2.95 to 3.25 eV. A small-sized InGaN semiconductor light-emitting device requiring small power consumption and having high efficiency can be employed as an excitation light source if the band gap of the shell is at least 2.95 eV, while sealing resin employed for the light-emitting apparatus can be prevented from deterioration if the band gap of the shell is not more than 3.25 eV. The band gap of the shell is particularly preferably in the range of 3.0 to 3.1 eV. When the band gap of the shell is in this range, the shell can efficiently absorb emission in the range of 400 to 410 nm exhibiting the highest quantum efficiency of the InGaN semiconductor light-emitting device, for obtaining white emission with small power consumption.

The second fluorescent material according to the present invention is a green fluorescent material comprising the aforementioned two-layer structure of the core and the shell covering the same. The core has ground state energy in the range of 2.3 to 2.5 eV and high order energy not in the range of 2.65 to 2.8 eV, and the second fluorescent material colors green with a peak wavelength of 500 to 540 nm by light absorption.

In the second fluorescent material according to the present invention, the ground state energy of the core is in the range of 2.3 to 2.5 eV, more preferably in the range of 2.35 to 2.40 eV. An emission wavelength remarkably exceeds that of green to deteriorate color rendering in white emission if the ground state energy of the core is less than 2.3 eV while the emission wavelength also remarkably exceeds that of green to deteriorate color rendering in white emission if the ground state energy of the core exceeds 2.5 eV, and the object of the present invention cannot be attained in either case. The ground state energy of the core can be measured in a similar manner to that in the aforementioned first fluorescent material.

In the second fluorescent material according to the present invention, the high order energy of the core is not in the range of 2.65 to 2.8 eV. If the high order energy of the core is in the range of 2.65 to 2.8 eV in the second fluorescent material according to the present invention, high order levels absorb blue emission when the second fluorescent material is mixed with a blue fluorescent material for obtaining white emission, to damage the color balance and deteriorate color rendering and the object of the present invention cannot be attained. The high order energy of the core can be measured similarly to that in the aforementioned first fluorescent material.

While the high order energy of the core is not particularly restricted in the present invention so far as the same is out of the aforementioned range, primary high order energy is preferably less than 2.65 eV and both of the primary high order energy and secondary high order energy are preferably less than 2.65 eV for a reason similar to that in the aforementioned first fluorescent material.

In the green fluorescent material implemented by the second fluorescent material according to the present invention, the high order energy does not overlap with emission energy corresponding to blue so that the green fluorescent material causes no light absorption when employed along with a blue illuminant. Therefore, the blue emission intensity is not damaged in white emission resulting from color mixing but white emission excellent in color purity and color rendering can be obtained.

In the second fluorescent material, the band gap of the shell is preferably larger than 2.8 eV, more preferably in the range of 2.95 to 3.25 eV. The band gap is particularly preferably in the range of 3.0 to 3.1 eV. A small-sized InGaN semiconductor light-emitting device requiring small power consumption and having high efficiency can be employed as an excitation light source if the band gap of the shell is at least 2.95 eV, while sealing resin employed for the light-emitting apparatus can be prevented from deterioration if the band gap of the shell is not more than 3.25 eV. When the band gap of the shell is in the range of 3.0 to 3.1 eV, further, the shell can efficiently absorb emission in the range of 400 to 410 nm exhibiting the highest quantum efficiency of the InGaN semiconductor light-emitting device, for obtaining white emission with small power consumption.

Figure 4:
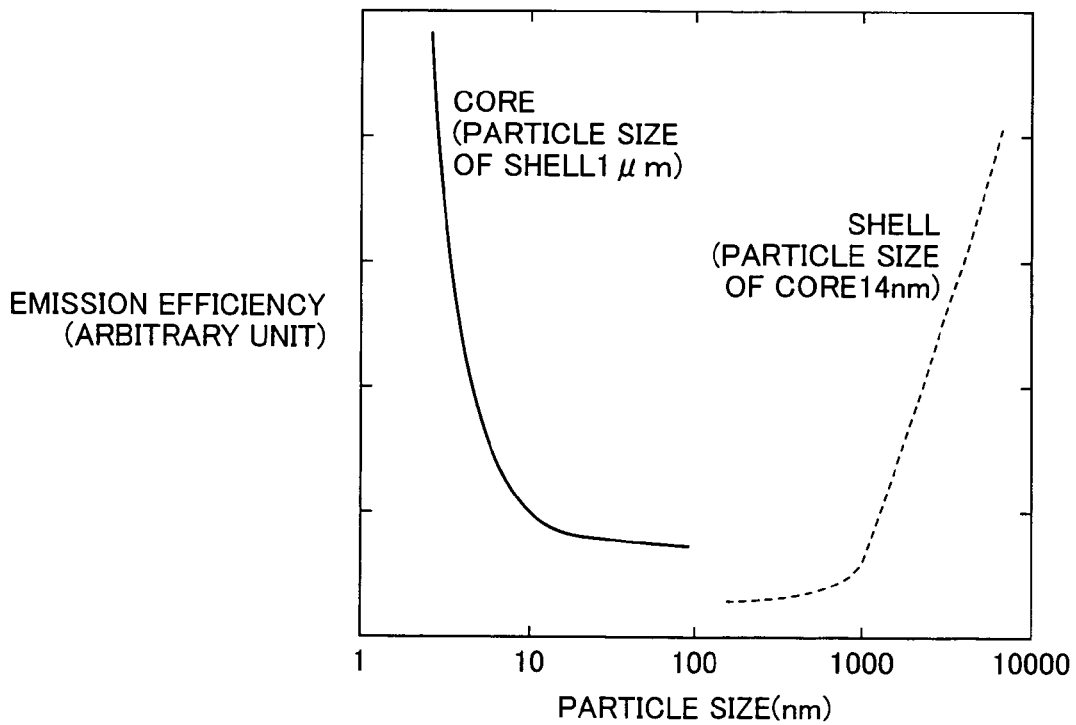
FIG. 4 is a graph showing results of emission efficiency measured at various particle sizes of a core and a shell as to a fluorescent material (more specifically, a red fluorescent material comprising a core of InN and a shell of $In_{0.1}Ga_{0.9}N$ covering this core) according to the present invention.

While the core may be of a size having a quantum effect in each of the first and second fluorescent materials as hereinabove described, the particle size thereof is preferably not more than twice the Bohr radius, more preferably at least ½ and not more than ⅔ of the Bohr radius. FIG. 4 is a graph showing results of emission efficiency measured at various particle sizes of a core and a shell as to a fluorescent material (more specifically, a red fluorescent material comprising a two-layer structure of a core of InN and a shell of $In_{0.1}Ga_{0.9}N$ covering this core) according to the present invention. It is understood from FIG. 4 that a quantum effect is increased when the particle size of the core is not more than 14 nm substantially corresponding to twice the Bohr radius. The Bohr radius, indicating broadening of the abundance ratio of excitons, is expressed as $4\pi \in h^2/me^2$, where $\in$ represents the dielectric constant, h represents the Planck's constant, m represents the effective mass and e represents the quantum of charges respectively. The Bohr radii of GaN and InN are about 3 nm and about 7 nm respectively. In each of the first and second fluorescent materials according to the present invention, emission efficiency resulting from a quantum effect is advantageously increased when the core is constituted of-microcrystals having a particle size of not more than twice the Bohr radius. The quantum effect is rendered remarkable as the particle size of the core is reduced, and the former is particularly remarkably increased if the latter is not more than ⅔ of the Bohr radius. If the quantum effect is excessively increased, however, the emission wavelength so varies with the particle size of the core that it is difficult to control the same, and hence the particle size of the core is preferably at least half the Bohr radius.

In each of the first and second fluorescent materials according to the present invention, the shape of the core, not particularly restricted but may be spherical, rectangular parallelepiped or polygonal or may have holes or projections, is preferably spherical due to spatially isotropic electron confinement. The aspect ratio (ratio of the maximum length to the minimum length) of a "spherical" core is 1 to 2. While the shape of the core is not restricted to spherical in the present invention as hereinabove described, it is assumed that the term "particle size" of the core indicates the average of the lengths of the microcrystals constituting the core in two directions perpendicular to the longest sides in this specification. The particle size of the core can be estimated by observing the shapes of the microcrystals constituting the core with a transmission electron microscope and measuring the aforementioned prescribed dimensions.

In each of the first and second fluorescent materials according to the present invention, the particle size of the shell is preferably at least 1 μm, more preferably at least 5 μm. In general, bonding remarkably results from surface levels in the vicinity of surfaces of fluorescent crystals, and hence absorption efficiency for primary light is reduced or energy transition to the core is damaged if the particle size of the shell is reduced. If the particle size of the shell is at least 1 μm, the area ratio of surface imperfections is reduced to improve absorption efficiency, and energy transition to the core is not damaged. Therefore, photoelectric conversion efficiency can be improved. While the shell preferably covers the overall surface of the core in each of the first and second fluorescent materials according to the present invention, the shell may cover the surface of the core while partially exposing the core so far as the aforementioned effects of the present invention are attained. The center of gravity of the shell may not necessarily coincide with that of the core. It is assumed that the term "particle size" of the shell indicates the particle size of the fluorescent material itself, comprising the two-layer structure of the core and the shell covering this core, in this specification.

The particle size of the shell is preferably not more than 100 μm, more preferably not more than 10 μm. The shell may be internally damaged before the light-emitting apparatus radiates light from the core to remarkably reduce emission efficiency if the particle size of the shell exceeds 100 μm. If the particle size of the shell exceeds 10 μm, the crystalline size of the fluorescent material is so increased that homogeneous color mixing is hardly attained to result in a tendency to color shading.

In each of the first and second fluorescent materials according to the present invention, the surface of the shell is preferably coated or adsorbed with a material different from those of the shell and the core. The term "coated" indicates such a state that the surface of the shell is covered with a material different from those of the shell and the core while chemical/physical interaction between the shell and the material different from those of the shell and the core is not defined, and the term "adsorbed" indicates such a state that the surface of the shell is covered with a material different from those of the shell and the core with some chemical/physical interaction between the shell and the material different from those of the shell and the core.

Figure 5:
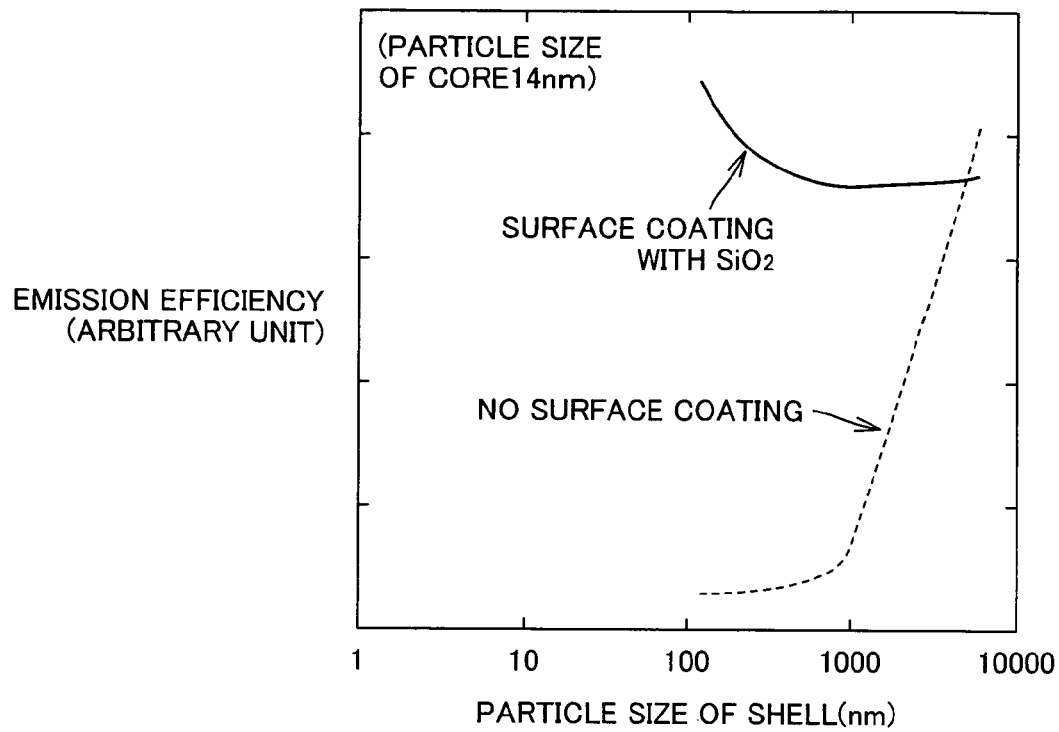
FIG. 5 is a graph showing results of emission efficiency measured at various particle sizes of a-shell as to a fluorescent material (more specifically, a red fluorescent material comprising a core of InN, a shell of $In_{0.1}Ga_{0.9}N$ covering this core and a layer of $SiO_2$ adsorbed to the surface of the shell) according to the present invention.

FIG. 5 is a graph showing results of emission efficiency measured at various particle sizes of a shell as to a fluorescent material (more specifically, a red fluorescent material comprising a core of InN, a shell of $In_{0.1}Ga_{0.9}N$ covering this core and a layer of $SiO_2$ adsorbed to the surface of the shell) according to the present invention. As hereinabove described, the particle size of the shell is preferably at least 1 μm in each of the first and second fluorescent materials according to the present invention. However, it is understood from FIG. 5 that emission efficiency is not remarkably reduced in the fluorescent material provided with the shell having the surface coated or adsorbed with a material different from those of the shell and the core also when the particle size of the shelf is less than 1 μm. This is conceivably because the material, different from those of the shell and the core, for coating or adsorbing the surface of the shell seals imperfections on the surface of the shell. Thus, the emission efficiency is preferably improved when the surface of the shell is coated or adsorbed with a material different from those of the shell and the core, also when the shell has a small particle size.

When the surface of the shell is coated or adsorbed with a material different from those of the shell and the core as described above, the different material terminates surface imperfections so that absorbed light energy can make a transition to the core without damage. Thus, the emission efficiency is improved in each of the first and second fluorescent materials. Particularly when the particle size of the shell is not more than I 1 μm in each of the first and second fluorescent materials, a remarkable effect of suppressing energy loss resulting from surface imperfections is attained and absorption efficiency is improved due to a quantum effect, whereby the emission efficiency is remarkably improved.

The material, different from those of the shell and the core, covering the surface of the shell in each of the first and second fluorescent materials can be prepared from an inorganic oxide such as $SiO_2$, $Ga_2O_3$, $In_2O_3$, $Al_2O_3$, ZnO, $Y_2O_3$, $TiO_2$, $ZrO_2$, $Ta_2O_3$ or MgO or organic molecules of methacrylic acid, acrylic acid, lauryl phosphate or trimethoxysilane, for example. In particular, the material different from those of the shell and the core is preferably prepared from an inorganic oxide having a high imperfection suppressing effect and high durability against heat or light irradiation over a long period as compared with an organic material, for providing a fluorescent material having high photoelectric conversion efficiency and excellent reliability while allowing easy formation. Among inorganic oxides, $SiO_2$ is particularly preferably employed for coating or adsorbing the surface of the shell in each of the first and second fluorescent materials so that the fluorescent material can be simply prepared at a low cost with no bad influence such as absorption of light emitted from the fluorescent material.

The method of coating or adsorbing the surface of the shell with the material different from those of the shell and the core is not particularly restricted but a well-known method can be properly selected in response to the material. When $SiO_2$ is employed as the material different from those of the core and the shell, for example, 3-mercaptopropyl trimethoxysilane and sodium citrate are added to the fluorescent material having the two-layer structure of the core and shell and surface-reacted to be adsorbed to the surface of the shell.

In each of the first and second fluorescent materials according to the present invention, the core can be prepared from a proper material generally widely employed as the material for a core of a fluorescent material in this field without particular restriction. The core can be made of a group III-V compound semiconductor, a group II-VI compound semiconductor, a group IV-IV compound semiconductor or a group I-III-VI compound semiconductor, for example. In particular, a group III-V compound semiconductor or a group II-VI compound semiconductor, which is a direct transition material generally having a band gap of 1 to 3 eV corresponding to the visible range controllable to a desired range by crystal mixing or size control and exhibiting excellent emission properties, is preferably employed for forming a large quantity of high-purity microcrystals with excellent reproducibility and obtaining a fluorescent material excellent in productivity with high emission efficiency as a result.

In each of the first and second fluorescent materials-according to the present invention, the core is preferably prepared from a group III-V compound semiconductor containing at least In or a group II-VI compound semiconductor containing at least Zn. When the core is prepared from a group III-V compound semiconductor containing at least In, the band gap can be simply controlled over a wide range of about 1 to 3 eV by crystal mixing for advantageously easily implementing visible emission. The group III element may include Al in addition to In, and the group V element may include at least one element selected from N, As and P. Also when the core is prepared from a group II-VI compound semiconductor containing at least Zn, visible emission can be advantageously easily implemented similarly to the aforementioned case of the group III-V compound semiconductor containing at least In. The group II element may include Cd and/or Te in addition to Zn, and the group VI element may include at least one element selected from S, Se and O.

More specifically, InN, $In_xGa_{1-x}N$ ($0 \leq x \leq 1$), InGaAlN, InGaBN, InGaAlAsP, InP, InGaP, InAlP, InGaAlP, InGaAsP, InAs, InAlAs or InGaAs is listed as the group III-V compound semiconductor containing at least In. Further, ZnO, ZnCdO, ZnMgO, ZnCdMgO, ZnTe, ZnCdTe, ZnMgTe, ZnMgCdTe, ZnS, ZnCdS, ZnMgS, ZnCdMgS, ZnSe, ZnCdSe, ZnMgSe, ZnCdMgSe or ZnMgCdSSeTe is listed as the group II-VI compound semiconductor containing at least Zn. The core preferably has a band gap smaller than 2.0 eV and does not contain As and Cd in view of a preferable quantum effect, and $In_xGa_{1-x}N$ ($0 \leq x \leq 1$) satisfying these conditions is particularly preferable as the material for the core.

In each of the first and second fluorescent materials according to the present invention, the shell can be prepared from a proper material generally widely employed as the material for a shell of a fluorescent material in this field without particular restriction, so far as the material has a larger band gap than the core material. The shell can be made of a group III compound semiconductor, a group II-VI compound semiconductor, a group IV-IV compound semiconductor or a group I-III-VI compound semiconductor, for example. In particular, a group III compound semiconductor or a group II-VI compound semiconductor, which is a material generally having a band gap of at least 2.8 eV corresponding to or exceeding the wavelength of blue light employed as excitation light controllable to a desired range by crystal mixing or size control and exhibiting excellent emission properties, is preferably employed for forming a large quantity of high-purity microcrystals with excellent reproducibility and obtaining a fluorescent material excellent in productivity with high emission efficiency as a result.

In each of the first and second fluorescent materials according to the present invention, the shell is preferably prepared from a group III nitride semiconductor containing at least Ga or a group II-VI compound semiconductor containing at least Zn. When the shell is prepared from a group III nitride semiconductor containing at least Ga, the band gap can be simply controlled over a wide range of at least about 2.8 eV by crystal mixing for advantageously easily implementing absorption of excitation light in blue to ultraviolet ranges. When the shell is prepared from a group II-VI compound semiconductor containing at least Zn, absorption of excitation light in blue to ultraviolet ranges can be easily implemented similarly to the aforementioned case of the group III nitride semiconductor containing at least In.

More specifically, GaN, $In_xGa_{1-x}N$ ($0 \leq x \leq 1$), InGaAlN and InGaBN is listed as the group III nitride semiconductor containing at least Ga. Further, ZnO, ZnCdO, ZnMgO, ZnCdMgO, ZnS, ZnCdS, ZnMgS, ZnCdMgS, ZnSe, ZnCdSe, ZnMgSe, ZnCdMgSe or ZnMgCdSSeTe is listed as the group II-VI compound semiconductor containing at least Zn. The shell preferably has a band gap larger than 2.8 eV and does not contain Ad and Cd in view of preferable absorption of excitation light in the blue to ultraviolet ranges, and $In_xGa_{1-x}N$ ($0 \leq x \leq 1$) is particularly preferable as the material for the shell.

In each of the first and second fluorescent materials according to the present invention, both of the core and the shell are made of $In_xGa_{1-x}N$ ($0 \leq x \leq 1$) in view of production efficiency and the cost. InGaN is most stable and excellent in reliability among the aforementioned compound semiconductors. When both of the core and the shell are constituted of InGaN-based semiconductors, therefore, the fluorescent material can encompass the said visible range, and exhibits high reliability and a low environmental load. Further, the fluorescent material is more chemically-stable and higher in reliability as compared with a group II-VI compound semiconductor.

Each of the first and second fluorescent materials according to the present invention can be formed on a substrate such as a sapphire substrate, an SiC substrate or a quartz glass substrate generally widely employed in this field without particular restriction. In particular, the inventive fluorescent material is preferably formed on a quartz glass substrate requiring a low cost. The fluorescent material may alternatively be formed on a plastic substrate or a resin film if the same can be formed at a low temperature.

The fluorescent material can be formed on a sapphire substrate, for example, by laser ablation. More specifically, the fluorescent material can be formed on the sapphire substrate by alternately ablating targets of sintered bodies of InN and $In_{0.1}Ga_{0.9}N$ with a KrF excimer laser and coating the core with the InGaN target for forming the shell before the InN target for forming the core is scattered at a desired particle size and reaches the sapphire substrate by controlling the optical output of the laser and the timing of ablation.

A linear or punctiform illuminant can be constituted not only by forming the fluorescent material on a substrate but also by recovering the formed fluorescent material as fine powder, dispersing the same in resin and thereafter forming the same. More specifically, the fine powder of the fluorescent material can be recovered by laser ablation by setting a collection filter in place of the substrate.

The method of forming the fluorescent material is not restricted to the aforementioned laser ablation, but the fluorescent material can be preferably formed by a proper well-known method such as gas source MBE (employing metallic In, metallic Ga and N plasma, for example) or chemical synthesis (employing $InCl_3$, $GaCl_3$ and $Li_3N$, for example).

The present invention also provides a light-emitting apparatus comprising a red fluorescent material and a green fluorescent material homogeneously dispersed in a medium for presenting white emission as a whole by absorbing blue excitation light with the red fluorescent material and the green fluorescent material and generating secondary light. The red fluorescent material comprises a two-layer structure of a core of a particle size having a quantum effect and a shell covering this core, the ground state energy of the core is in the range of 1.85 to 2.05 eV, and the high order energy of the core is not in the ranges of 2.3 to 2.5 eV and 2.65 to 2.8 eV (i.e., the aforementioned first fluorescent material according to the present invention), while the green fluorescent material comprises a two-layer structure of a core of a particle size having a quantum effect and a shell covering this core, the ground state energy of the core is in the range of 2.3 to 2.5 eV, and the high order energy of the core is not in the range of 2.65 to 2.8 eV (i.e., the aforementioned second fluorescent material according to the present invention). Thus, a light-emitting apparatus presenting white emission excellent in energy conversion efficiency, color purity and color rendering can be obtained without damaging green and blue emission intensities in white emission caused by color mixing by employing the aforementioned first fluorescent material so designed that the high order energy thereof does not absorb green and blue emission as the red fluorescent material and employing the second fluorescent material so designed that the high order energy thereof does not absorb blue emission as the green fluorescent material.

The light-emitting apparatus according to the present invention preferably further comprises a light-emitting device (blue light-emitting device), having a peak wavelength in the range of 380 to 420 nm, made of a group III nitride semiconductor or a group II-VI compound semiconductor as a light source emitting the excitation light. More preferably, the light-emitting device has a peak wavelength in the range of 400 to 410 nm and is made of a group m nitride semiconductor. The group III nitride semiconductor or the group II-VI compound semiconductor can efficiently obtain ultraviolet to blue-green emission over a wide range of 300 to 500 nm. White emission excellent in color purity can be implemented by employing this blue light-emitting device as the excitation light source and mixing the blue emission with red/green secondary light. This excitation light source contains no ultraviolet light component shorter than 380 nm, whereby deterioration of resin employed for a dispersive medium or the like is reduced and the light-emitting apparatus can attain high reliability. In particular, the group III nitride semiconductor, superior in emission efficiency and reliability to the group II-IV compound semiconductor for exhibiting particularly high emission efficiency in the peak emission wave range of 400 to 410 nm, is preferably employed as the excitation light source.

More specifically, GaN, InN, AlN, $In_xGa_{1-x}N$ ($0 \leq x \leq 1$), $Al_yGa_{1-y}N$ ($0 \leq y \leq 1$), $Al_zGa_{1-z}N$ ($0 \leq z \leq 1$) or InGaAlN is listed as the group III nitride semiconductor. Further, ZnO, CdO, MgO, ZnCdO, ZnMgO, CdMgO, MgCdZnO, ZnS, CdS, MgS, ZnCdS, ZnMgS, ZnCdMgS, ZnSe, CdSe, MgSe, ZnCdSe, ZnMgSe, CdMgSe, ZnCdMgSe, ZnMgCdSSeTe or ZnMgSSe is listed as the group II-VI compound semiconductor. In particular, the group III nitride semiconductor emitting excitation light of the blue to ultraviolet ranges in high efficiency and containing no As and Cd is preferable as the material for the light-emitting device. In particular, $In_xGa_{1-x}N$ ($0 \leq x \leq 1$) having higher external quantum efficiency in blue-violet emission in the range of 380 to 420 nm as compared with the remaining wavelengths and the remaining semiconductors is preferable as the material for an emission layer of the light-emitting device.

In the light-emitting apparatus according to the present invention, the light-emitting device is not restricted to a light-emitting diode employing spontaneous emission but an SLD (superluminescent diode) or a semiconductor laser device employing induced emission may alternatively be employed. In particular, the semiconductor laser device having a narrow spectral line width can advantageously implement a light-emitting apparatus having extremely high energy conversion efficiency by selecting the peak wavelength at a level maximizing the external quantum efficiency of the light-emitting device and the excitation efficiency of the fluorescent material.

An ultraviolet light-emitting device having a peak wavelength in the ultraviolet range of not more than 380 nm can also be employed as the light source for excitation light. However, it is not preferable to employ the ultraviolet light-emitting device for the excitation light source for reasons that (1) a GaN-based semiconductor light-emitting device is most excellent in portability, power saving and reliability and exhibits the highest external quantum efficiency at an emission wavelength of 380 to 420 nm and that (2) if excitation light includes ultraviolet light, general-purpose organic resin (such as epoxy resin or acrylic resin, for example) suitable as a fluorescent material dispersive medium is easily deteriorated by the ultraviolet light and hence a light-emitting apparatus employing such excitation light is reduced in reliability. In other words, the aforementioned blue light-emitting device having the peak wavelength in the range of 380 to 420 nm is most suitable as the light source for emitting excitation light in the light-emitting apparatus according to the present invention, and it is preferable to set the band gap of the shell to efficiently absorb this excitation light.

The light-emitting apparatus according to the present invention preferably includes a blue fluorescent material comprising a two-layer structure of a core of a particle size having a quantum effect and a shell covering this core with the ground state energy of the core in the range of 2.65 to 2.8 eV in the aforementioned medium. While the light-emitting apparatus according to the present invention can be so formed that the aforementioned excitation light source also emits blue light, efficiency of the light-emitting apparatus is reduced if the blue wavelength having excellent color rendering and the emission wavelength of the semiconductor device exhibiting the highest external quantum efficiency do not coincide with each other. In this case, the ratio between light absorbed by the fluorescent materials and light not absorbed but scattered to be mixed with red and green emission must be controlled. When the medium includes the blue fluorescent material independently of the excitation light source, light absorption/scattering may not be controlled but the filling factor of the fluorescent material in the medium can be increased. Further, color rendering is not damaged when the excitation light source is optimized to a wavelength exhibiting high external quantum efficiency. Therefore, the light-emitting apparatus can attain excellent emission efficiency and productivity.

In the light-emitting apparatus according to the present invention, the medium is preferably organic resin including at least any resin selected from epoxy resin, silicon resin, polycarbonate resin and acrylic resin. When the medium for dispersing the red and green fluorescent materials is prepared from organic resin, a medium excellent in dispersibility and workability for the red and green fluorescent materials can be implemented. The medium can attain low hygroscopicity and excellent dimensional stability when prepared from epoxy resin, and attains high transmissiveness for visible light when prepared from acrylic resin. When prepared from silicon resin or polycarbonate resin, the medium can attain excellent durability against blue-violet emission. The medium can be prepared from a combination of the aforementioned organic resin materials as a matter of course, and durability of the medium is improved against both of a short-wavelength component of the excitation light and outside air when the medium has a two-layer structure of silicon resin employed on the side of the excitation light source and epoxy resin employed on the side of a light emission surface opposite to the excitation light source, for example.

In the light-emitting apparatus according to the present invention, the medium may be prepared from glass in place of the aforementioned organic resin. With the medium of glass which is remarkably superior in light transmission property and durability to organic resin, excellent in dispersibility for the fluorescent materials and at a low cost, the light-emitting apparatus having excellent reliability can be manufactured at a low cost.

The filling factors of the red and green fluorescent materials in the medium and the ratio therebetween are so adjusted that red emission and green emission from the fluorescent materials are mixed with a scattered component of blue emission of the excitation light to present white emission. If the medium is prepared from epoxy resin, for example, the total filling factor of the fluorescent materials is preferably 5 percent by weight to 50 percent by weight, the ratio of the red fluorescent material is preferably 30 percent by weight to 50 percent by weight, and the ratio of the green fluorescent material is preferably 3 percent by weight to 30 percent by weight.

In the light-emitting apparatus according to the present invention, the emission efficiency is increased as the distance between the light-emitting device and the medium is reduced, and hence the light-emitting device and the medium may be provided to be in contact with each other. Alternatively, a gap or light-transmitting thermal conductor constituted of AlN or SiC may be provided between the light-emitting device and the medium in order to prevent the medium from deterioration resulting from heat generated by the light-emitting device.

The medium preferably includes a light diffusion material scattering and color-mixing primary light and/or the secondary light. The light diffusion material has an action of not absorbing but scattering light itself for homogeneously mixing red emission, green emission and blue emission in the medium with each other. This light diffusion material can be prepared from a well-known material such as $SiO_2$, $TiO_2$, ZnO or polystyrene particles, for example, and particularly preferably prepared from $SiO_2$ particles having excellent durability, requiring a low cost and not absorbing emission of the fluorescent materials. When the medium includes this light diffusion material, the secondary light can be so easily color-mixed that white light is inhibited from color irregularity and visibility of the white light is improved as a result.

Figure 6:
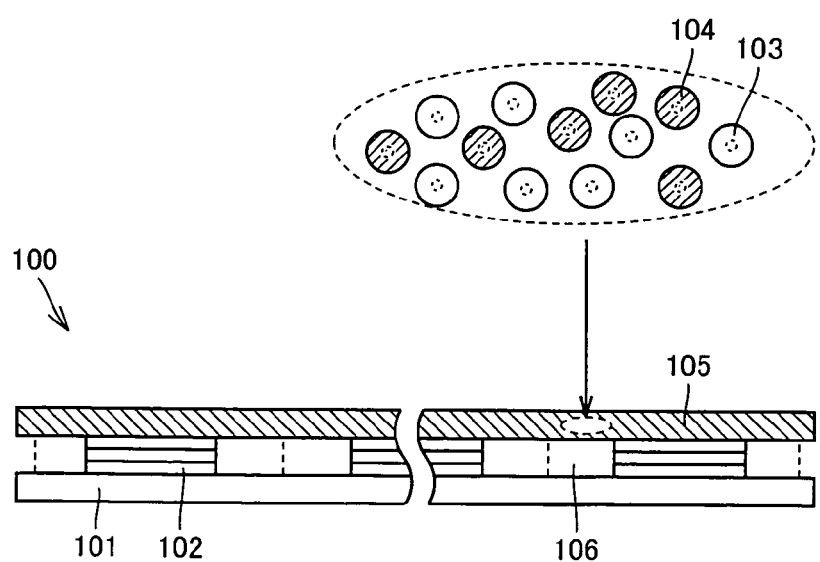
FIG. 6 is a structural sectional view showing a light-emitting apparatus 100 according a first preferred embodiment of the present invention in a simplified manner.

FIG. 6 is a structural sectional view showing a light-emitting apparatus 100 according a first preferred embodiment of the present invention in a simplified manner. In the light-emitting apparatus 100 according to the first embodiment shown in FIG. 6, light-emitting devices 102 serving as light sources emitting excitation light are arranged on a support substrate 101, and a plate medium 105 in which a red fluorescent material (the first fluorescent material according to the present invention) 103 and a green fluorescent material (the second fluorescent material according to the present invention) 104 are homogeneously dispersed is arranged on the light-emitting devices 102. While the size and arrangement of the light-emitting devices 102 are not particularly restricted in the light-emitting apparatus 100 according to the present invention, the light-emitting devices 102 shown in FIG. 6 are prepared from blue light-emitting diodes of 300 μm square arrayed at regular intervals of 50 μm, for example. The support substrate 101 can be prepared from an arbitrary material such as glass, plastic or ceramics, for example, so far as the same can support the arrayed light-emitting devices 102 and the medium 105 in which the red and green fluorescent materials 103 and 104 are dispersed. The support substrate 101 can alternatively be formed by a substrate for epitaxy prepared from a group III nitride semiconductor such as sapphire, and labor for arranging and wiring the light-emitting devices 102 can be remarkably saved if a substrate having the light-emitting devices 102 arrayed thereon is employed as the support substrate 101 as such. Referring to FIG. 6, partitions 106 are employed for partitioning the light-emitting devices 102. The surfaces of the partitions 106 are preferably made of a material such as Al, Pt or Ag, for example, having high light reflectance for efficiently reflecting light incident upon the partitions 106 toward the medium 105 containing the fluorescent materials 103 and 104.

Figure 7:
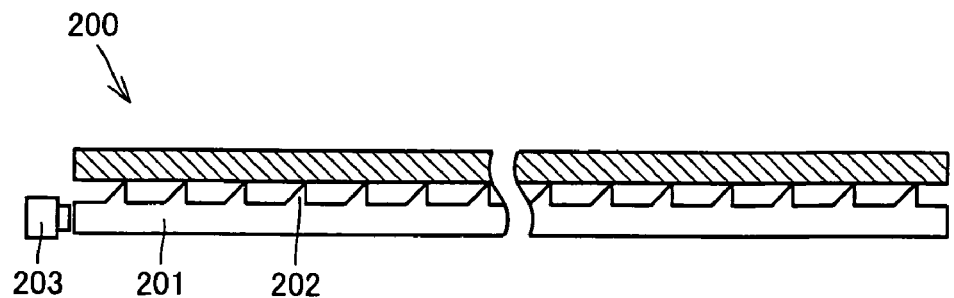
FIG. 7 is a structural sectional view showing a light-emitting apparatus 200 according a second preferred embodiment of the present invention in a simplified manner.

FIG. 7 is a structural sectional view showing a light-emitting apparatus 200 according a second preferred embodiment of the present invention in a simplified manner. The light-emitting apparatus 200 shown in FIG. 7 has a structure similar to that of the light-emitting apparatus 100 shown in FIG. 6 except that a support substrate (light guide) 201 having a light guide function for transmitting light having a wavelength of 380 to 420 nm with a surface formed with prescribed irregularities 202. A light-emitting device 203 serving as a light source for excitation light is formed by a surface emission type group III nitride semiconductor laser device having a peak lasing wavelength of 420 nm for constituting a surface emission type white light-emitting apparatus emitting excitation light from the side surface of the light guide 202. In the light-emitting apparatus 200 having this structure, the excitation light source may not be planarly arranged in a large number, dissimilarly to the light-emitting apparatus 100 shown in FIG. 6.

Figure 8:
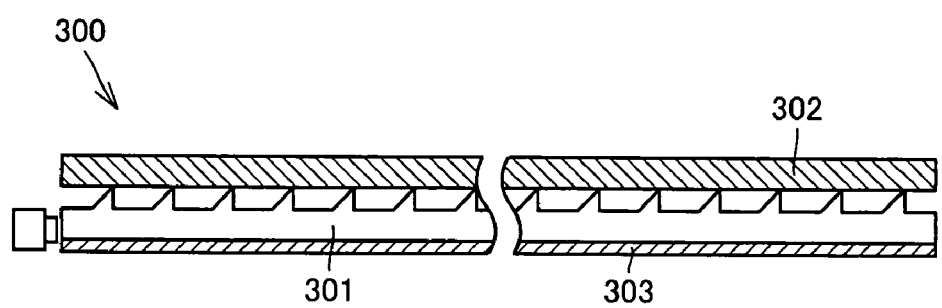
FIG. 8 is a structural sectional view showing a light-emitting apparatus 300 according a third preferred embodiment of the present invention in a simplified manner.

FIG. 8 is a structural sectional view showing a light-emitting apparatus 300 according a third preferred embodiment of the present invention in a simplified manner. The light-emitting apparatus 300 shown in FIG. 8 has a structure similar to that of the light-emitting apparatus 200 shown in FIG. 7 except that a reflector 303 reflecting excitation light and/or secondary light is provided to be opposed to a medium 302 through a light guide 301 similar to the aforementioned light guide 301, i.e., through a light source emitting excitation light. The aforementioned reflector 303 is so provided on the side of the excitation light, which is a non-emission surface, opposite to the medium 302 that light emitted from the excitation light source oppositely to the medium 302 can be reflected and guided toward the medium 302. The reflector 303 similarly reflects secondary light for collecting the same in the direction of emission while suppressing scattering and loss. Consequently, the light-emitting apparatus 300 is further improved in energy efficiency as compared with the light-emitting apparatus 200 shown in FIG. 7.

While the material for the reflector 303 is not particularly restricted so far as the same can reflect the excitation light and/or the secondary light, a metallic material such as Ag, Pt or Al having high reflectance for general visible light is preferably employed. The reflector 303 may alternatively be formed by coating a support plate made of proper resin, glass or ceramics with the aforementioned metallic material.

Figure 9:
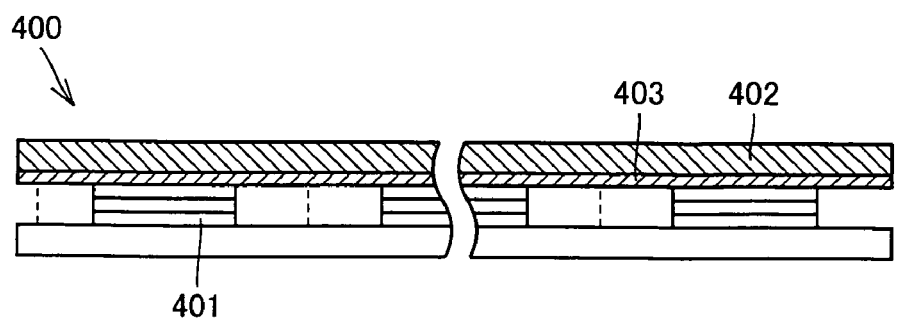
FIG. 9 is a structural sectional view showing a light-emitting apparatus 400 according a fourth preferred embodiment of the present invention in a simplified manner.

FIG. 9 is a structural sectional view showing a light-emitting apparatus 400 according a fourth preferred embodiment of the present invention in a simplified manner. The light-emitting apparatus 400 shown in FIG. 9 has a structure similar to that of the light-emitting apparatus 100 shown in FIG. 6 except that an optical film (optical filter) 403 transmitting excitation light and blocking secondary light is provided between arrayed light-emitting devices (blue light-emitting diodes) 401 serving as light sources for the excitation light and a medium 402. The light-emitting apparatus 400 provided with the optical film 403 can prevent the secondary light from being emitted or scattered toward the excitation light sources and causing loss, for improving emission efficiency without damaging excitation efficiency.

The optical film 403 preferably blocks ultraviolet light of less than 380 nm in wavelength. The light-emitting apparatus 400 provided with the optical film 403 blocking the ultraviolet light of less than 380 nm in wavelength can block ultraviolet light components slightly contained in hems of the spectra of the excitation light sources. These ultraviolet light components do not contribute to excitation of fluorescent materials but cause deterioration of the medium 402 or the optical film 403 itself if the same is prepared from organic resin. Further, the light-emitting apparatus 400 provided with the optical film 403 can prevent secondary light from the fluorescent materials from being radiated toward the excitation light sources and causing loss. In other words, the light-emitting apparatus 400 can be improved in emission efficiency and remarkably improved also in reliability due to this structure.

The optical film 403 preferably has a function of transmitting only light of 380 to 420 nm in wavelength while reflecting light of other wavelengths. Thus, the light-emitting apparatus 400 can efficiently excite the fluorescent materials.

The material for the optical film 403 is not particularly restricted but a well-known material can be properly employed. For example, the optical film 403 can be formed by a glass substrate prepared by stacking multilayer films of organic resin such as polycarbonate or polyester coated with an optical filter material such as $CaF_2$, $MgF_2$ or ZnSe or dielectric materials. In particular, the optical film 403 is preferably formed by a glass substrate coated with $MgF_2$ requiring a low cost and having high reliability.

Figure 10:
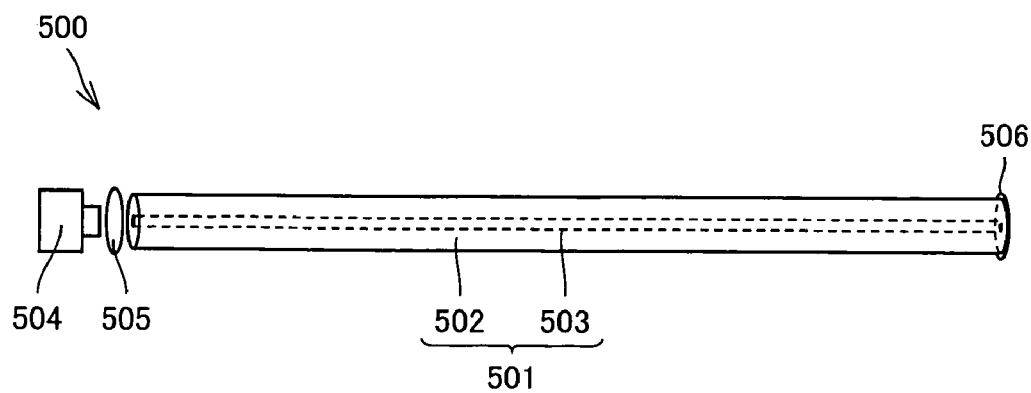
FIG. 10 is a structural sectional view showing a light-emitting apparatus 500 according a fifth preferred embodiment of the present invention in a simplified manner.

FIG. 10 is a structural sectional view showing a light-emitting apparatus 500 according a fifth preferred embodiment of the present invention in a simplified manner. In the light-emitting apparatus 500 shown in FIG. 10, an optical fiber member 501 having a core 502 and a cladding material 503 is employed as a wavelength conversion part for partially leaking excitation light guided through the core 502 toward the cladding material 503 in which a red fluorescent material (the first fluorescent material according to the present invention) and a green fluorescent material (the second fluorescent material according to the present invention) are dispersed. In other words, the light-emitting apparatus 500 shown in FIG. 10 utilizes the cladding material 503 of the optical fiber member 501 as a medium, and the present invention also includes the light-emitting apparatus 500 having this structure. While the optical fiber member 501 can be properly prepared from a well-known material with no particular restriction, the core 502 is preferably prepared from acrylic resin such as PMMA (polymethyl methacrylate) and the cladding material 503 is preferably prepared from fluororesin such as vinylidene fluoride or PTFE (polytetrafluoroethylene) so that the fluorescent materials can be simply dispersed therein. Alternatively, glass fiber of fluoride glass, boron glass or silica may be employed for attaining the effects of the present invention. The cladding material 503 may further contain a blue fluorescent material and a light diffusion material.

In the light-emitting apparatus 500, a light-emitting device 504 serving as a light source for the excitation light is preferably formed by an end emission type group III nitride semiconductor laser device having a peak lasing wavelength of 405 nm. The light-emitting device 504 may alternatively be formed by a light-emitting diode or a surface emission type semiconductor laser device. In the light-emitting apparatus 500, a lens 505 or the like is preferably provided between the optical fiber member 501 and the group III nitride semiconductor laser device 504, in order to improve bond efficiency. Further, a reflector 506 reflecting the excitation light is preferably provided oppositely to the optical fiber member 501 coupled with the light source for the excitation light.

The light-emitting apparatus 500 shown in FIG. 10 can be employed as a linear white light source or an illumination light source substituting for a general fluorescent tube, or assembled into a flexible surface light source.

Figure 11:
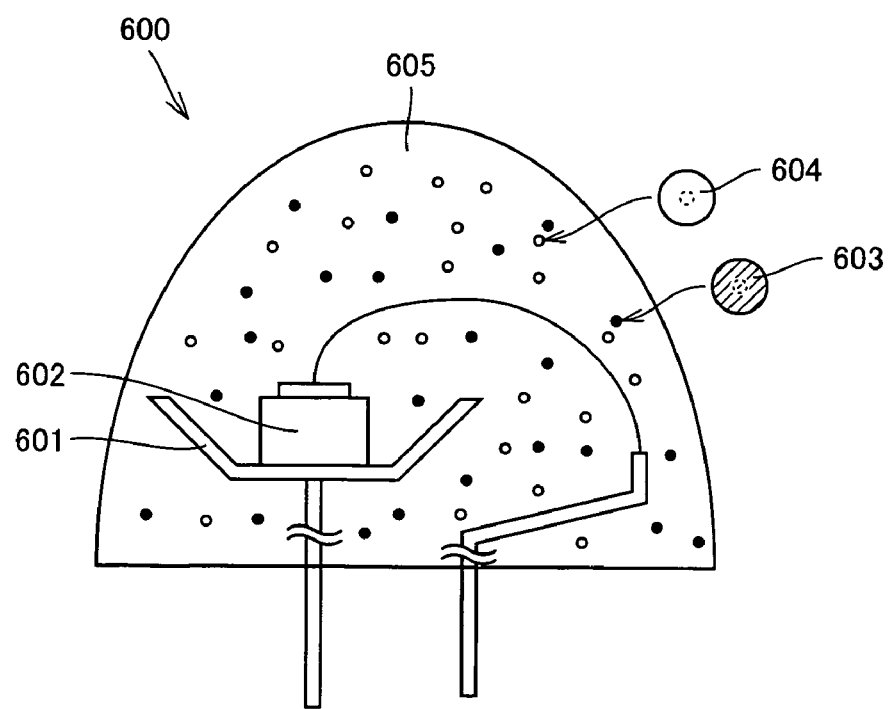
FIG. 11 is a structural sectional view showing a light-emitting apparatus 600 according a sixth preferred embodiment of the present invention in a simplified manner.

FIG. 11 is a structural sectional view showing a light-emitting apparatus 600 according a sixth preferred embodiment of the present invention in a simplified manner. The light-emitting apparatus 600 shown in FIG. 11 is obtained by sealing a light-emitting device 602 serving as a light source for excitation light with a medium 605 of epoxy resin in which a red fluorescent material 603 (the first fluorescent material according to the present invention) and a green fluorescent material 604 (the second fluorescent material according to the present invention) are dispersed. The medium 605 may further contain a blue fluorescent material and a light diffusion material.

In the light-emitting apparatus 600, the light-emitting device 602 serving as the light source for the excitation light is preferably formed by an end emission type group III nitride semiconductor laser device having a peak lasing wavelength of 405 nm. The light-emitting device 602 may alternatively be formed by a surface emission or end emission semiconductor laser device.

The light-emitting apparatus 600 shown in FIG. 11 can be employed as a punctiform white light source, and a plurality of such light-emitting apparatuses 600 can be combined with each other for forming a linear or surface light source. In this case, the linear or surface light-emitting apparatus can be more miniaturized and complicated in shape as compared with the aforementioned surface or linear light-emitting apparatus according to the present invention.

While the present invention is now described in more detail with reference to Examples, the present invention is not restricted to these Examples.

EXAMPLE 1

According to Example 1, the present invention was applied to a red fluorescent material employing group III nitride semiconductors.

A fluorescent material comprising a two-layer structure of a core of InN having a particle size of 13 nm and a shell of $In_{0.1}Ga_{0.9}N$ covering this core was prepared (such a fluorescent material comprising a core and a shell both made of $In_xGa_{1-x}N$ ($0 \leq x \leq 1$) is hereinafter referred to as "InGaN fluorescent material"). According to Example 1, the InGaN fluorescent material was deposited on a sapphire substrate by laser ablation. More specifically, targets of sintered bodies of InN and $In_{0.1}Ga_{0.9}N$ were alternately ablated with a KrF excimer laser and the optical output of the laser and the ablation timing were so controlled that the core was coated with the InGaN target for forming the shell before the InN target for forming the core was scattered at a desired particle size and reached the sapphire substrate. When the emission spectrum of the InGaN fluorescent material obtained in the aforementioned manner was measured, red emission having a peak fluorescent wavelength of 620 nm was obtained.

The InGaN fluorescent material according to Example 1 was color-mixed with blue and green light-emitting diodes having peak wavelengths of 450 nm and 525 nm respectively, for obtaining white emission. When the absorption spectrum of only the InN core constituting the InGaN fluorescent material was measured, absorption was observed at 605 nm and 585 nm both deviating from the emission wavelengths of the blue and green light-emitting diodes, as shown in FIG. 2. Thus, it has been recognized that the core did not absorb blue and green emission so that the InGaN fluorescent material attained desired color balance.

COMPARATIVE EXAMPLE 1

An InGaN fluorescent material according to comparative example 1 was prepared similarly to Example 1, except that a core of $In_{0.75}Ga_{0.25}N$ having a particle size of 6 nm was employed. When the emission spectrum of the InGaN fluorescent material according to comparative example 1 obtained in this manner was measured similarly to Example 1, red emission having a peak fluorescent wavelength of 620 nm was obtained.

When the InGaN fluorescent material according to comparative example 1 was color-mixed with blue and green light-emitting diodes having peak wavelengths of 450 nm and 525 nm respectively similarly to Example 1, it was not possible to obtain white emission. When the absorption spectrum of only the InGaN core constituting the InGaN fluorescent material was measured, the InGaN core exhibited absorption at 540 nm, to absorb light of the green light-emitting diode as shown in FIG. 2. In other words, it has been recognized that the core of the red fluorescent material according to comparative example 1 designed to obtain white emission absorbed green emission, to reduce the emission intensity and change color balance. The reason for this light absorption is conceivably coincidence of energy corresponding to high order levels of the core with light energy of green emission in comparative example 1.

EXAMPLE 2

According to Example 2, 3-mercaptopropyl trimethoxysilane and sodium citrate were added to a fluorescent material comprising a two-layer structure of a core of InN having a particle size of 14 nm and a shell of $In_{0.1}Ga_{0.9}N$ having a particle size of 3 µm covering this core for adsorbing $SiO_2$ molecules to the surface of the shell by surface reaction. Also according to Example 2, the InGaN fluorescent material was deposited on a sapphire substrate by laser ablation similarly to Example 1.

In the InGaN fluorescent material according to Example 2 obtained in the aforementioned manner, emission efficiency was not remarkably reduced but improved as compared with the InGaN fluorescent material according to Example 1 despite the particle size of not more than 1 µm of the shell.

EXAMPLE 3

According to Example 3, the present invention was applied to a green fluorescent material employing group III nitride semiconductors.

A fluorescent material (InGaN fluorescent material) comprising a two-layer structure of a core of $In_{0.3}Ga_{0.7}N$ having a particle size of 10 nm and a shell of $In_{0.1}Ga_{0.9}N$ having a particle size of 1.2 µm covering this core was prepared. Also according to Example 3, the InGaN fluorescent material was deposited on a sapphire substrate by laser ablation, similarly to Example 1. When the emission spectrum of the InGaN fluorescent material obtained in the aforementioned manner was measured, green emission of having a peak fluorescent wavelength of 530 nm was obtained.

The InGaN fluorescent material according to Example 3 was color-mixed with blue and red light-emitting diodes having peak wavelengths of 450 nm and 625 nm respectively, for obtaining white emission. When the absorption spectrum of only the InGaN core constituting the InGaN fluorescent material was measured, absorption was observed at 505 nm and 525 nm, and it has been recognized that the core did not absorb blue emission so that the InGaN fluorescent material attained desired color balance.

COMPARATIVE EXAMPLE 2

An InGaN fluorescent material according to comparative example 2 was prepared similarly to Example 3, except that a core of $In_{0.5}Ga_{0.5}N$ having a particle size of 5 nm was employed. When the emission spectrum of the InGaN fluorescent material according to comparative example 2 obtained in this manner was measured similarly to Example 1, green emission having a peak fluorescent wavelength of 530 nm was obtained.

When the InGaN fluorescent material according to comparative example 3 was color-mixed with blue and red light-emitting diodes having peak wavelengths of 450 nm and 625 nm respectively similarly to Example 1, it was not possible to obtain white emission. When the absorption spectrum of only the InGaN core constituting the InGaN fluorescent material was measured, the InGaN core exhibited absorption at 450 nm, to absorb light of the blue light-emitting diode. The reason for this light absorption in comparative example 2 is conceivably coincidence of energy corresponding to high order levels of the InGaN core with light energy of blue emission, similarly to the case of comparative example 1.

EXAMPLE 4

According to Example 4, the present invention was applied to a red fluorescent material employing group II-VI compound semiconductors.

A fluorescent material comprising a two-layer structure of a core of CdSe having a particle size of 8 nm and a shell of ZnSe having a particle size of 1.2 µm covering this core was prepared (such a fluorescent material is hereinafter referred to as "ZnCdSe fluorescent material"). According to Example 4, the ZnCdSe fluorescent material was deposited on a sapphire substrate by laser ablation, similarly to Example 1. When the emission spectrum of the ZnCdSe fluorescent material obtained in the aforementioned manner was measured, red emission of having a peak fluorescent wavelength of 640 nm was obtained.

The ZnCdSe fluorescent material according to Example 4 was color-mixed with blue and green light-emitting diodes having peak wavelengths of 450 nm and 525 nm respectively, for obtaining white emission. When the absorption spectrum of only the CdSe core constituting the ZnCdSe fluorescent material was measured, absorption lines were observed at 620 nm and 600 nm, and it has been recognized that the core did not absorb green emission so that the ZnCdSe fluorescent material attained desired color balance.

COMPARATIVE EXAMPLE 3

A ZnCdSe fluorescent material according to comparative example 3 was prepared similarly to Example 1, except that a core of $Zn_{0.5}Cd_{0.5}Se$ having a particle size of 3.5 nm was employed. When the emission spectrum of the ZnCdSe fluorescent material according to comparative example 3 obtained in this manner was measured similarly to Example 4, red emission having a peak fluorescent wavelength of 640 nm was obtained.

When the ZnCdSe fluorescent material according to comparative example 3 was color-mixed with blue and green light-emitting diodes having peak wavelengths of 450 nm and 525 nm respectively similarly to Example 1, it was not possible to obtain white emission. When the absorption spectrum of only the ZnCdSe core constituting the ZnCdSe fluorescent material was measured, the ZnCdSe core exhibited absorption at 525 nm, to absorb light of the green light-emitting diode.

EXAMPLE 5

According to Example 5 of the present invention, the light-emitting apparatus 100 shown in FIG. 6 was prepared with the InGaN fluorescent material (red fluorescent material) according to Example 1 and the InGaN fluorescent material (green fluorescent material) according to Example 3. The support substrate 101 was prepared from quartz glass. As the light-emitting devices 102, blue light-emitting diodes of a group III nitride semiconductor of 300 µm square having a peak wavelength of 420 nm were arrayed at regular intervals of 50 µm. The partitions 106 of Al were inserted between the light-emitting diodes 102. The medium 105 was prepared from platelike epoxy resin, in which the red and green fluorescent materials were dispersed at a total filling factor of 70 percent by weight with ratios of 55 percent by weight and 12 percent by weight of the red and green fluorescent materials respectively.

When a current was fed to the light-emitting devices 102 of this light-emitting apparatus 100, the medium 105 emitted white light from the surface thereof. Energy efficiency calculated by setting the light-emitting apparatus 100 in an integrating sphere, collecting the emitted white light for measuring the quantity of the total luminous flux and dividing the same by power consumed by the light-emitting devices 102 serving as excitation light sources was 80[L m/W]. CIE daylight (color temperature: 5000 K) was employed as a reference illuminant and eight colors of red, yellow, yellow-green, green, blue-green, blue-violet, violet and red-violet (lightness: 6, chroma: 7) were employed as test colors, for calculating color rendering indices of the light-emitting apparatus 100 as follows:

$$R_1 = 100 - 4.6 \times \Delta E_i$$

where i, taking any value of 1 to 8, represents any of the aforementioned eight test colors. The general color rendering index Ra calculated by averaging the respective color rendering indices according to the following equation was 90:

$$Ra = \Sigma(i = 1 \text{ to } 8) R_1 \times \frac{1}{8}$$

COMPARATIVE EXAMPLE 4

A light-emitting apparatus according to comparative example 5 was prepared similarly to Example 5 except that the InGaN fluorescent materials according to comparative examples 1 and 2 were employed as red and green fluorescent materials respectively.

When a current was fed to light-emitting devices for driving this light-emitting apparatus, only reddish emission was obtained. This light-emitting apparatus exhibited energy conversion efficiency of 30 [lm/W] and a general color rendering index Ra of 30.

However the total filling factor and the ratios of the InGaN red and green fluorescent materials in epoxy resin were varied, it was not possible to obtain white emission having color rendering similar to that of the aforementioned Example 5.

EXAMPLE 6

A light-emitting apparatus according to Example 6 of the present invention was prepared similarly to Example 5, except that glass was employed for a medium in which fluorescent materials were dispersed.

When a current was fed to light-emitting devices for driving this light-emitting apparatus, a medium emitted white light from the surface thereof This light-emitting apparatus exhibited energy conversion efficiency of 80 [lm/W] and a general color rendering index Ra of 90.

When driven at a constant illuminance of 2000 lm, the light-emitting apparatus according to Example 6 required a time of 10000 hours for increasing an operating current by 20% while the light-emitting apparatus according to Example 5 employing epoxy resin required 3000 hours. Thus, it is understood that a light-emitting apparatus employing a medium of glass is remarkably improved in reliability due to superior durability against short-wavelength light as compared with a light-transmitting apparatus employing a medium of organic resin.

EXAMPLE 7

According to Example 7 of the present invention, the light-emitting apparatus 200 shown in FIG. 7 was prepared similarly to Example 5, except that the support substrate 201 transmitting light of 380 to 400 nm was formed by a light guide provided with a surface having the prescribed irregularities 202 and a surface emission type group III nitride semiconductor laser device 203 having a peak lasing wavelength of 420 nm was employed as an excitation light source for applying excitation light to the side surface of the light guide 201.

When a current was fed to light-emitting devices for driving this light-emitting apparatus 200, a medium emitted white light from the surface thereof This light-emitting apparatus 200 exhibited energy conversion efficiency of 80 [lm/W] and a general color rendering index Ra of 90.

EXAMPLE 8

An InGaN blue fluorescent material having a peak emission wavelength of 425 nm prepared by covering a core of InN having a particle size of 4.5 nm with a shell of $In_{0.1}Ga_{0.9}N$ having a particle size of 1.2 µm was introduced into a medium. The peak wavelength of a group III nitride light-emitting diode serving as a light source for emitting excitation light was set to 405 nm. A light-emitting apparatus according to Example 8 of the present invention was prepared similarly to Example 5 except these points.

When a current was fed to a light-emitting device for driving the light-emitting apparatus, the medium emitted white light from the surface thereof This light-emitting apparatus exhibited energy conversion efficiency of 90 [lm/W] and a general color rendering index Ra of 95. In the light-emitting apparatus according to Example 8 employing the fluorescent material emitting blue light independently of the excitation light source, absorption and scattering of the excitation light source may not be controlled but the filling factor of the fluorescent material in the medium can be improved. Further, color rendering can be controlled with the emission wavelength of the blue fluorescent material, whereby the wavelength of the excitation light can be individually controlled.

EXAMPLE 9

A light-emitting apparatus according to Example 9 of the present invention was prepared similarly to Example 8, except that $SiO_2$ particles of about 1 µm in particle size were dispersed in a medium as a light diffusion material in addition to red, green and blue fluorescent materials.

When a current was fed to light-emitting devices for driving this light-emitting apparatus, the medium emitted white light from the surface thereof The light-emitting apparatus exhibited energy conversion efficiency of 95 [lm/W] and a general color rendering index Ra of 95.

EXAMPLE 10

According to Example 10, the light-emitting apparatus 300 shown in FIG. 8 was prepared similarly to Example 5 except that the metallic reflector 303 reflecting excitation light and secondary light was set on the surface of the light guide 301 opposite to the medium 302.

When a current was fed to a light-emitting device for driving the light-emitting apparatus 300, the medium 302 emitted white light from the surface thereof. The light-emitting apparatus 300 exhibited energy conversion efficiency of 100 [lm/W] and a general color rendering index Ra of 95. In the light-emitting apparatus 300 provided with the reflector 303, the reflector 303 reflected excitation light emitted oppositely to the medium 302 toward the medium 302 so that the excitation light contributed to excitation of a fluorescent material. The reflector 303 also reflected secondary light emitted from the fluorescent material oppositely to a light emission surface toward the light emission surface for extracting the same. Thus, the energy conversion efficiency of the light-emitting apparatus 300 according to Example 10 was more improved to 100 [lm/W] as compared with the remaining light-transmission apparatuses according to Examples 1 to 9.

EXAMPLE 11

According to Example 11 of the present invention, the light-emitting apparatus 400 shown in FIG. 9 was prepared similarly to Example 5, except that the optical film 403 blocking ultraviolet light of less than 380 nm in wavelength was provided between the light-emitting devices 401 and the medium 402.

When a current was fed to the light-emitting devices 401 for driving the light-emitting apparatus 400, the medium 402 emitted white light from the surface thereof The light-emitting apparatus 400 exhibited energy conversion efficiency of 105 [lm/W] and a general color rendering index Ra of 95.

When driven at a constant illuminance of 2000 lm similarly to Example 6, the light-emitting apparatus 400 according to Example 11 required a time of 15000 hours for increasing an operating current by 20%. Thus, the light-emitting apparatus 400 according to Example 11 provided with the optical film 403 blocking ultraviolet light was improved in durability due to suppression of deterioration of resin forming the medium 402.

EXAMPLE 12

A light-emitting apparatus according to Example 12 of the present invention was prepared similarly to Example 11, except that an optical film having a function of transmitting only light having a wavelength of 380 to 420 nm while reflecting light of the remaining wavelengths was provided between light-emitting devices and a medium.

When a current was fed to the light-emitting devices for driving the light-emitting apparatus, the medium emitted white light from the surface thereof The light-emitting apparatus exhibited energy conversion efficiency of 110 [lm/W] and a general color rendering index Ra of 95.

When driven at a constant illuminance of 2000 lm similarly to Example 11, the light-emitting apparatus according to Example 12 required a time of 15000 hours for increasing an operating current by 20%.

EXAMPLE 13

According to Example 13 of the present invention, the light-emitting apparatus 500 shown in FIG. 10 was prepared with the optical fiber member 501 having the cladding material 503 in which the InGaN fluorescent material (red fluorescent material) according to Example 1 and the InGaN fluorescent material (green fluorescent material) according to Example 3 were dispersed was employed, The optical fiber member 501 having the core 502 of PMMA covered with the cladding material 503 of PTFE for partially leaking excitation light guided through the core 502.toward the cladding material 503. The blue fluorescent material employed in Example 8 and the light diffusion material ($SiO_2$) employed in Example 9 were further dispersed in the cladding material 503.

The light-emitting device 504 serving as the light source for the excitation light was formed by an end emission type group III nitride semiconductor laser device having a peak lasing wavelength of 405 nm. Further, the lens 505 was provided between the optical fiber member 501 and the group III nitride semiconductor laser device 504, while the reflector 506 reflecting the excitation light was provided oppositely to the optical fiber member 501 coupled with the light source for the excitation light.

When a current was fed to the light-emitting device 504 for driving the light-emitting apparatus 500, the light-emitting apparatus 500 emitted white light. The light-emitting apparatus 500 having this structure can be employed as a linear white light source or an illumination light source substituting for a general fluorescent tube, or assembled into a flexible surface light source. The light-emitting apparatus 500 exhibited energy conversion efficiency of 80 [lm/W] and a general color rendering index Ra of 90.

EXAMPLE 14

According to Example 14 of the present invention, the light-emitting apparatus 600 shown in FIG. 11 was prepared by sealing the light-emitting device 602 set on a cuplike lead frame 601 with the medium 605 of epoxy resin in which the InGaN fluorescent material 603 (red fluorescent material) according to Example 1 and the InGaN fluorescent material 604 (green fluorescent material) according to Example 3 were dispersed. The blue fluorescent material employed in Example 8 and the light diffusion material ($SiO_2$) employed in Example 9 were further dispersed in the medium 605.

The light-emitting device 602 serving as the light source for the excitation light was formed by an end emission type group III nitride semiconductor laser device having a peak lasing wavelength of 405 nm.

When a current was fed to the light-emitting device 602 for driving the light-emitting apparatus 600, the light-emitting apparatus 600 emitted white light. The light-emitting apparatus 600 having this structure can be employed as a punctiform white light source, and a plurality of such light-emitting apparatuses 600 can be combined with each other for forming a linear or surface light source. This light-emitting apparatus 600 can be more miniaturized and complicated in shape as compared with the aforementioned surface or linear light-emitting apparatus. The light-emitting apparatus 600 exhibited energy conversion efficiency of 80 [lm/W] and a general color rendering index Ra of 90.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A fluorescent material comprising a two-layer structure of a core of a particle size having a quantum effect and a shell covering said core, wherein particle size of the core and composition ratio of the fluorescent material are such that the ground state energy of said core is in the range of 2.3 to 2.5 eV and the high order energy of said core is not in the ranges of 2.65 to 2.8 eV, said fluorescent material coloring red with a peak wavelength of 500 to 540 nm by light absorption.

2. The fluorescent material according to claim 1, wherein the band gap of said shell is larger than 2.8 eV.

3. The fluorescent material according to claim 1, wherein the particle size of said core is not more than twice the Bohr radius.

4. The fluorescent material according to claim 1, wherein the particle size of said shell is at least 1 μm.

5. The fluorescent material according to claim 1, wherein the surface of said shell is coated or adsorbed with a material different from the materials of said shell and said core.

6. The fluorescent material according to claim 5, wherein said material for coating or adsorbing the surface of said shell is an inorganic oxide.

7. The fluorescent material according to claim 1, wherein said core is made of a group III-V compound semiconductor containing at least In or a group II-VI compound semiconductor containing at least Zn.

8. The fluorescent material according to claim 7, wherein said shell is made of a group III nitride semiconductor containing at least Ga or a group II-VI compound semiconductor containing at least Zn.

9. The fluorescent material according to claim 8, wherein both said core and shell are made of $In_xGa_{1-x}N$ ($0 \leqq x \leqq 1$).

10. A light-emitting apparatus comprising a red fluorescent material and a green fluorescent material homogeneously dispersed in a medium for presenting white emission as a whole by absorbing blue excitation light with said red fluorescent material and said green fluorescent material and generating secondary light, wherein
said red fluorescent material comprises a two-layer structure of a core of a particle size having a quantum effect and a shell covering said core, wherein particle size of the core and composition ratio of the fluorescent material are such that the ground state energy of said core is in the range of 1.85 to 2.05 eV, and the high order energy of said core is not in the ranges of 2.3 to 2.5 eV and 2.65 to 2.8 eV, and
said green fluorescent material comprises a two-layer structure of a core of a particle size having a quantum effect and a shell covering said core, wherein praticle size of the core and composition ratio of the fluorescent material are such that the ground state energy of said core is in the range of 2.3 to 2.5 eV, and the high order energy of said core is not in the range of 2.65 to 2.8 eV.

11. The light-emitting apparatus according to claim 10, further comprising a light-emitting device, having a peak wavelength in the range of 380 to 420 nm, made of a group III nitride semiconductor or a group II-VI compound semiconductor as a light source emitting said excitation light.

12. The light-emitting apparatus according to claim 10, including a blue fluorescent material, comprising a two-layer structure of a core of a particle size having a quantum effect and a shell covering said core with the ground state energy of said core in the range of 2.65 to 2.8 eV, in said medium.

13. The light-emitting apparatus according to claim 10, wherein said medium contains at least any material selected from epoxy resin, silicon resin, polycarbonate resin and acrylic resin.

14. The light-emitting apparatus according to claim 10, wherein said medium is glass.

15. The light-emitting apparatus according to claim 10, wherein said medium includes a light diffusion material scattering and color-mixing primary light and/or said secondary light.

16. The light-emitting apparatus according to claim 10, further comprising a reflector provided oppositely to said medium through a light source emitting said excitation light for reflecting said excitation light and/or said secondary light.

17. The light-emitting apparatus according to claim 10, further comprising an optical film provided between a light source emitting said excitation light and said medium for transmitting said excitation light while blocking said secondary light.

18. The light-emitting apparatus according to claim 17, wherein said optical film blocks ultraviolet light having a wavelength of less than 380 nm.

* * * * *